United States Patent
Jensen

(10) Patent No.: US 10,254,325 B1
(45) Date of Patent: Apr. 9, 2019

(54) PIEZOELECTRIC FIELD DISTURBANCE SENSING SYSTEM AND METHOD

(71) Applicant: The United States of America as Represented by the Administrator of the National Aeronautics & Space Administration, Washington, DC (US)

(72) Inventor: Scott Jensen, Carriere, MS (US)

(73) Assignee: The United States of America as represented the Administrator of the National Aeronautics and Space Administration, Washington, DC (US)

( * ) Notice: Subject to any disclaimer, the term of this patent is extended or adjusted under 35 U.S.C. 154(b) by 396 days.

(21) Appl. No.: 14/691,623

(22) Filed: Apr. 21, 2015

Related U.S. Application Data

(60) Provisional application No. 61/982,474, filed on Apr. 22, 2014.

(51) Int. Cl.
*G01J 5/44* (2006.01)
*G01R 29/22* (2006.01)
*G01H 11/08* (2006.01)

(52) U.S. Cl.
CPC ............. *G01R 29/22* (2013.01); *G01H 11/08* (2013.01)

(58) Field of Classification Search
CPC ........... G01H 11/08; G01R 29/22; G01V 7/08
USPC .......................................................... 324/727
See application file for complete search history.

(56) References Cited

U.S. PATENT DOCUMENTS

| | | | | |
|---|---|---|---|---|
| 4,835,435 A | * | 5/1989 | Yeung | B41J 2/125 310/323.21 |
| 5,824,904 A | * | 10/1998 | Kouhei | G01P 15/0915 210/357 |
| 6,510,738 B1 | * | 1/2003 | Lee | G01H 11/08 310/312 |
| 8,401,820 B2 | | 3/2013 | Jensen et al. | |
| 2014/0077662 A1 | * | 3/2014 | Lueke | H01L 41/1136 310/339 |

FOREIGN PATENT DOCUMENTS

WO    WO 2014206614 A1 * 12/2014 ........... F04D 27/001

OTHER PUBLICATIONS

Suresh et al. "Design of a resonance-based mass sensor using a self-sensing piezoelectric actuator", Smart Materials and Structures, vol. 21, No. 2 Jan. 2012, pp. 1-6.*

(Continued)

*Primary Examiner* — Melissa J Koval
*Assistant Examiner* — Courtney G McDonnough
(74) *Attorney, Agent, or Firm* — Matthew F. Johnston; Bryan A. Geurts; Mark P. Dvorscak

(57) ABSTRACT

A piezoelectric field disturbance sensing system includes a piezoelectric element for generating mechanical energy when electrically excited and for generating electrical energy when mechanically deformed. A mass is coupled to the piezoelectric element. A signal generator is coupled to the piezoelectric element for applying electrical energy thereto for a fixed period of time. As a result, the piezoelectric element undergoes mechanical deformation and the mass reverberates in response to such mechanical deformation. A charge monitor is coupled to the piezoelectric element for monitoring electrical energy generated thereby during a time period subsequent to the fixed period of time.

22 Claims, 3 Drawing Sheets

(56) References Cited

OTHER PUBLICATIONS

Bo Wang et al. "Piezoelectric self sensing actuator for vibration suppression based on time sharing method", Control and Automation (ICCA), 2010 8th IEEE International Conference on Control and Automation, pp. 1403-1408.*

* cited by examiner

PIEZOELECTRIC FIELD DISTURBANCE SENSING SYSTEM AND METHOD

CROSS-REFERENCE TO RELATED PATENT APPLICATIONS

Pursuant to 35 U.S.C. § 119, the benefit of priority from provisional application 61/982,474, with a filing date of Apr. 22, 2014, is claimed for this non-provisional application.

ORIGIN OF THE INVENTION

The invention described herein was made by an employee of the United States Government and may be manufactured and used by or for the Government of the United States of America for governmental purposes without the payment of any royalties thereon or therefore.

BACKGROUND OF THE INVENTION

1. Field of the Invention

This invention relates to field disturbance sensing. More specifically, the invention is a field disturbance sensing system and method using one or more piezoelectric elements.

2. Description of the Related Art

The sensing of an environment's or structure's attributes or state is critical in a wide variety of applications. Sensors and sensing systems are typically specifically designed for their particular function. The attributes or states to be sensed can include gravity, vibration energy, as well as local electrical, magnetic, thermal, electromotive, and radio frequency fields; therefore, sensors and sensing systems are as varied as the attributes and states they must sense. This leads to a time-consuming and costly cycle of "design, test, build" for sensors and their sensing systems because there is no real standard sensor building block that can be adapted to sense a variety of attributes and/or states.

SUMMARY OF THE INVENTION

Accordingly, it is an object of the present invention to provide a sensing system and method that can serve as the building block for a wide variety of attribute or state sensing applications.

Another object of the present invention is to provide a sensing system and method that is readily adapted to be sensitive to disturbances in local energy fields.

Other objects and advantages of the present invention will become more obvious hereinafter in the specification and drawings.

In accordance with the present invention, a piezoelectric field disturbance sensing system includes a piezoelectric element for generating mechanical energy when electrically excited and for generating electrical energy when mechanically deformed. A mass is coupled to the piezoelectric element. A signal generator is coupled to the piezoelectric element for applying electrical energy thereto for a fixed period of time, wherein the piezoelectric element undergoes mechanical deformation and wherein the mass reverberates in response to such mechanical deformation. A charge monitor is coupled to the piezoelectric element for monitoring electrical energy generated thereby during a time period subsequent to the fixed period of time.

BRIEF DESCRIPTION OF THE DRAWINGS

Other objects, features, and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
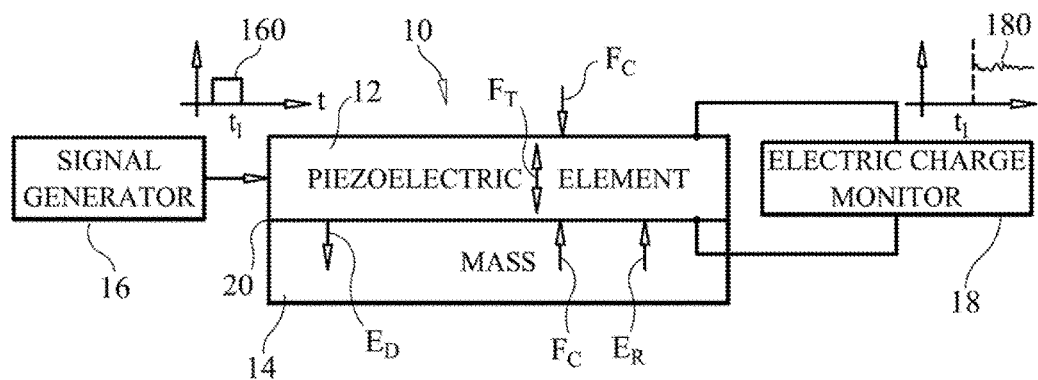
FIG. 1 is a schematic view of a piezoelectric field disturbance sensing system in accordance with an embodiment of the present invention.
Figure 2:
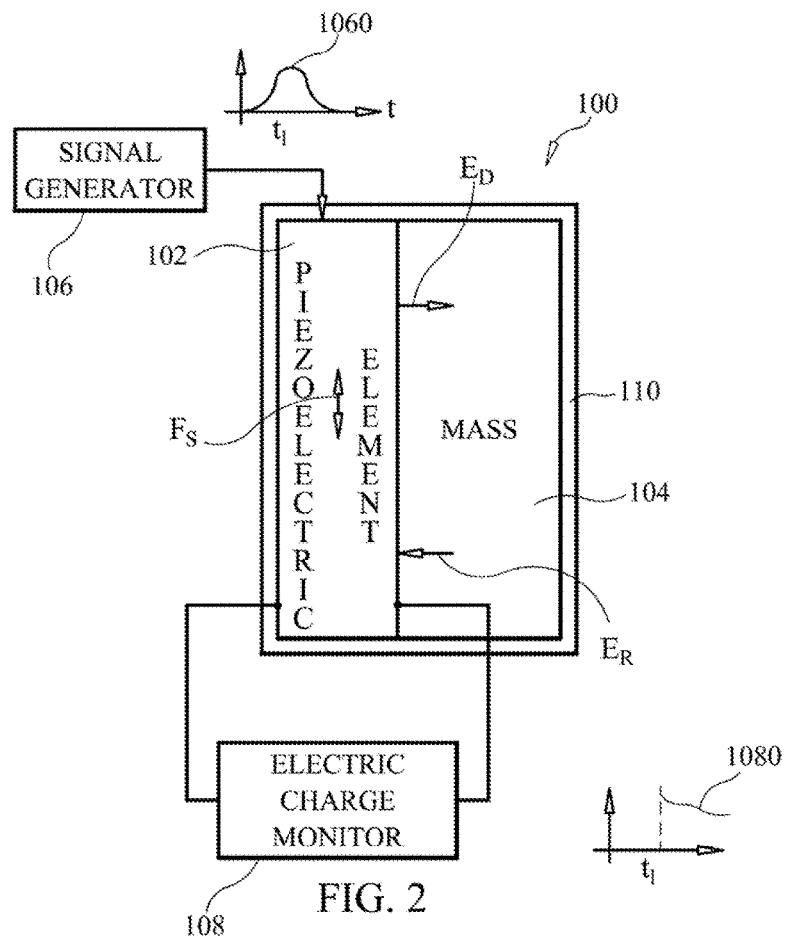
FIG. 2 is a schematic view of a piezoelectric field disturbance sensing system in accordance with another embodiment of the present invention.

Referring now to the drawings and more particularly to FIGS. 1 and 2, piezoelectric field disturbance sensing systems in accordance with embodiments of the present invention are shown and are referenced generally by numeral 10 (FIG. 1) and numeral 100 (FIG. 2). As will be explained further herein, each of sensing systems 10 and 100, and the method of operating same, can serve as the building block for a wide variety of sensing applications to include, for example, the sensing/monitoring of a variety of fields or forces to include gravitational fields/forces, vibrations, magnetic fields/forces, electric fields/forces, electromotive fields/forces, electromagnetic fields/forces, electro-static fields/forces, radio frequency fields, and thermal fields. For ease of description, it is to be understood that the use of the term "fields" hereinafter also includes forces where appropriate. While the basic structure of the present invention's sensing systems and method remain the same for each application, a support system (not shown in FIGS. 1 and 2) for the sensing system can include structure(s) that desensitize the sensing system with respect to one or more of the above-mentioned fields that are not of interest. By way of an illustrative example, a piezoelectric gravimeter constructed using a sensing system of the present invention will be explained further below.

Referring first to FIG. 1, sensing system 10 includes a piezoelectric element 12, a mass 14, a signal generator 16, and an electric charge monitor 18. Piezoelectric element 12 is a compressive-type piezoelectric element that generates electric charge when mechanically deformed by compressive forces "$F_C$" or tensile forces "$F_T$" acting thereon. Piezoelectric element 12 can also be mechanically deformed when excited by electric energy, i.e., the inverse piezoelectric effect. Piezoelectric element 12 can be sensitive to mechanical deformation in multiple dimensions or a single dimension. Similarly, piezoelectric element 12 can mechanically deform in multiple dimensions or a single dimension when electrically excited. For example, if the sensing system of the present invention is to be used as a gravimeter, it may be desirable to make piezoelectric element 12 sensitive and excitable to deformation in a single dimension that can be aligned with the direction of the local gravitational field that is to be sensed and/or monitored. For example, by utilizing piezoelectric crystals as the piezoelectric element 12.

Mass 14 is coupled to piezoelectric element 12 such that mechanical deformation energy generated by piezoelectric element 12 can be imparted to mass 14 for reverberation therein, and such that the subsequent reverberation of mass 14 can be imparted to piezoelectric element 12. In system 10, such coupling of piezoelectric element 12 to mass 14 is achieved by use of an adhesive 20 to bond the two together. The present invention is not limited to coupling of the piezoelectric element to a mass via an adhesive bond, as any method of attachment that is compatible with the piezoelectric element can be used without departing from the scope of the present invention. To support reverberation energy, mass 14 is a hard/rigid material such as hardened steel, glass, etc.

Signal generator 16 can be any type of electrical excitation device that applies electrical energy to piezoelectric element 12 such that piezoelectric element 12 undergoes mechanical deformation in accordance with its particular type or design. In general, signal generator 16 applies electrical energy to piezoelectric element 12 for some fixed period of time "t" terminating at a known time. For example, signal generator 16 can apply a pulse 160 of electrical energy to piezoelectric element 12 where pulse 160 terminates at a time "$t_1$". It is to be understood that the present invention is not limited to excitation by a single electric pulse as other types of fixed-duration excitation signals can be used without departing from the scope of the present invention.

When piezoelectric element 12 is excited to mechanical deformation, the energy of deformation or "$E_D$" is imparted to mass 14. In general and as is known in the art, piezoelectric element 12 resonates at one or more frequencies such that the energy of deformation $E_D$ correspondingly resonates into mass 14. As a result, mass 14 reverberates in response to energy of deformation $E_D$. As mass 14 reverberates, it is exposed to one or more external stimuli that can affect the mass's reverberation, e.g., dampen the reverberations, enhance the reverberations, shift the frequency(ies) of the reverberations, etc. As a result, mass 14 generates an energy of reverberation or "$E_R$" that is indicative of a measurement of the external stimuli and that is imparted to piezoelectric element 12. The energy of reverberation $E_R$ causes mechanical deformation of piezoelectric element 12 that, in turn, generates electrical energy that is monitored/measured by change monitor 18. More specifically, the relevant electrical energy signal 180 monitored by charge monitor 18 occurs after the exciting electrical energy terminates, e.g., at the conclusion of pulse 160 or after time $t_1$.

Referring now to FIG. 2, another sensing system 10 in accordance with the present invention includes a piezoelectric element 102, a mass 104, a signal generator 106, and an electric charge monitor 108. In this embodiment, piezoelectric element 102 is a shear-type piezoelectric element that generates electric charge when mechanically deformed by shear forces "$F_S$" acting thereon. Similar to the embodiment illustrated in FIG. 1, piezoelectric element 102 can also be mechanically deformed when excited by electric energy in accordance with the inverse piezoelectric effect. Piezoelectric element 102 can be configured for sensitivity/excitation in a single dimension or multiple dimensions without departing from the scope of the present invention. Mass 104 is similar in structure and function to mass 14 described earlier herein. However, in system 100, mass 104 is clamped against piezoelectric element 102 by a clamping device 110 (e.g., a band or strap wrapped around piezoelectric element 102 and mass 104). Signal generator 106 and change monitor 108 are similar to the above-described signal generator 16 and charge monitor 18, respectively. However, in system 100, signal generator 106 applies a non-pulse, fixed-duration excitation signal 1060 (terminating at time $t_1$) to piezoelectric element 102 thereby causing it to resonate. The resulting energy of deformation $E_D$ is imparted to mass 104, and the subsequently-generated energy of reverberation $E_R$ is imparted to piezoelectric element 102. Mechanical deformation of piezoelectric element 102 caused by energy of reverberation $E_R$ causes piezoelectric element 102 to generate electrical energy that is monitored/measured (as signal 1080) after time $t_1$ by charge monitor 108.

In the above-described embodiments, it is to be understood that each piezoelectric element can be realized by a plurality of piezoelectric structures (e.g., a stacked arrangement, an array of piezoelectric crystals, etc.) without departing from the scope of the present invention. Accordingly, the term piezoelectric element as used herein includes a variety of piezoelectric structures that exhibit the piezoelectric effect and the inverse piezoelectric effect. For example, low-level and/or non-linear piezoelectric elements can be used. Further, a stacked arrangement of piezoelectric structures could be used to provide an increased mechanical deformation output for a given excitation energy level and/or an increased electric energy output for a given amount of mechanical deformation. Still further, the mass used in each sensing system can be realized by a single piece of material or multiple pieces coupled together without departing from the scope of the present invention. For example, the amount of mass and/or its size or shape can be used to adjust sensitivity of the sensing system and/or adjust the sensing system's resistance to damage.

Figure 3:
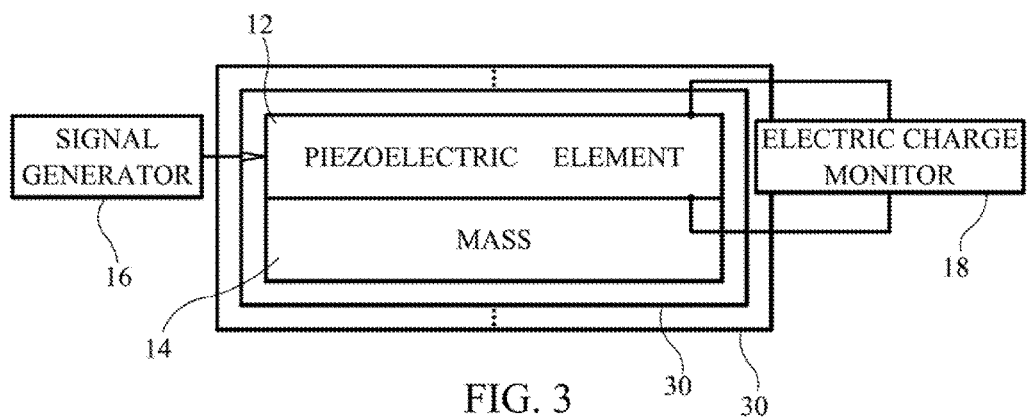
FIG. 3 is a schematic view of a shielded piezoelectric field disturbance sensing system in accordance with another embodiment of the present invention.

As mentioned above, systems 10 and 100 can serve as the building block for a variety of sensing applications. In some applications, one or more external stimuli that are not of interest could impact the sensing system's piezoelectric element. In order to prevent or desensitize the piezoelectric element relative to such unwanted stimulation, and thereby limit its deformation to that caused by the mass's energy of reverberation, it may be necessary to provide shielding and/or isolation structures. Accordingly, for the general case, one or more shielding or isolation structures can be provided. For example, FIG. 3 illustrates multiple shielding/isolation structures 30 where each one can be customized to desensitize piezoelectric element 12 to one or more particular external stimulus/stimuli.

Figure 4:
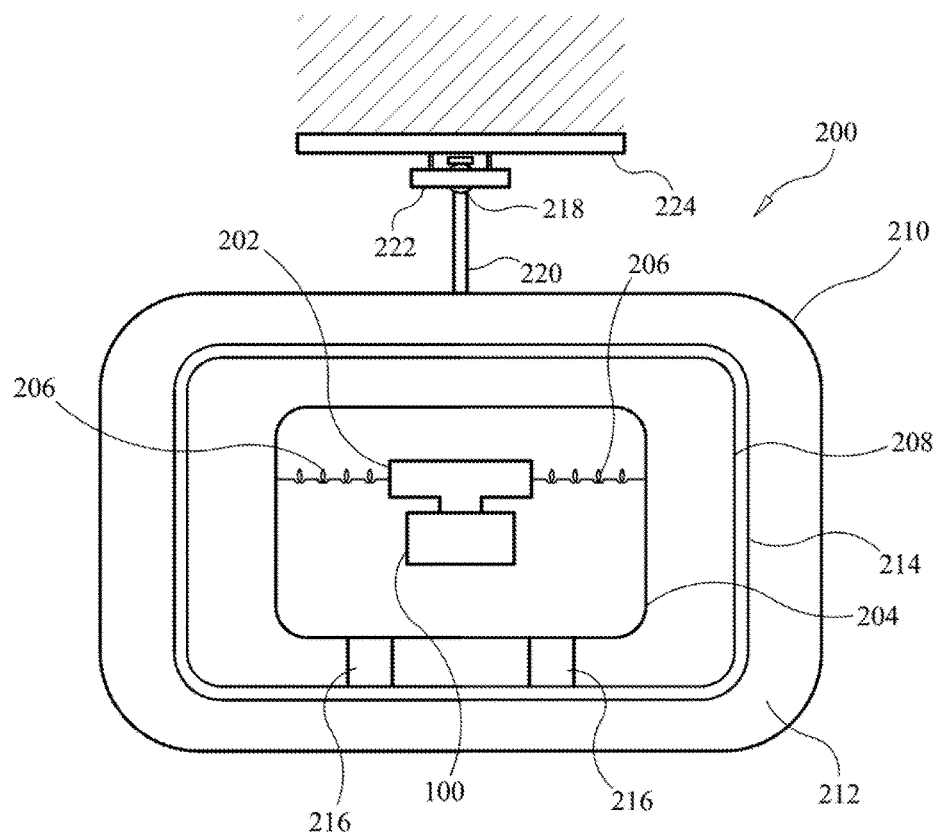
FIG. 4 is a schematic view of a shielded piezoelectric gravimeter in accordance with an embodiment of the present invention.

By way of an illustrative example, a piezoelectric gravimeter based on the above-described sensing system is illustrated in FIG. 4 and is referenced generally by numeral 200. In the illustrated embodiment, sensing system 100 is mounted on a support block 202 that is suspended in an inner radio frequency (RF) shielding box 204 by means of springs 206 coupled to support block 202 and RF shielding box 204. Note that the signal generator and charge monitor portions of sensing system 100 need not be mounted on support block 202 and can be located outside of the shielding/isolation structures of gravimeter 200 as would be understood by one of ordinary still in the art. However, for clarity of illustration, the signal generator and charge monitor portions of sensing system 100 have been omitted from FIG. 4. A multi-layer shielding/isolation structure encases and supports RF shielding box 204. The multi-layer structure includes an inner RF shielding box 208, an outer RF shielding box 210, thermal and vibration insulating material 212 disposed between boxes 208 and 210, and a magnetic shield/coating 214 encasing/coating RF shielding box 208. Support mounts 216 are used to position/support shielding box 204 and its contents within the multi-layer shielding/isolation structure, while the multi-layer shielding/isolation structure is coupled to a swivel 218 by a support rod 220. Swivel 218 is mounted in a standoff mount 222 that is rigidly coupled to an overhead base 224.

Gravitational forces have a dampening effect on any mechanical energy imparted to the mass of sensing system 100. The sensitivity of sensing system 100 to the surrounding gravitational forces can be controlled by tuning the suspended sensing system mass to the response of the sensing system's piezoelectric element.

Figure 5:
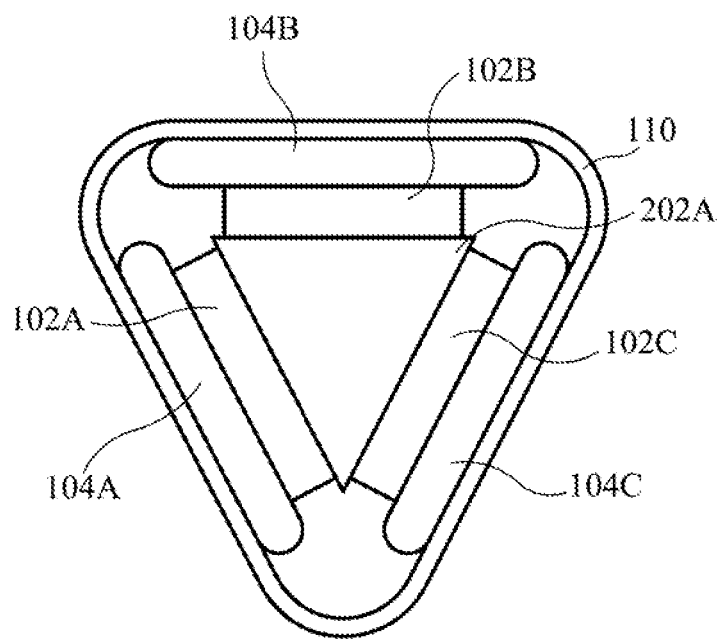
FIG. 5 is a schematic plan view of a multiple piezoelectric element and corresponding mass arrangement for use in a piezoelectric gravimeter in accordance with an embodiment of the present invention.

An embodiment of a multiple piezoelectric element and mass structure of sensing system 100 for use in gravimeter 200 is illustrated in FIG. 5. Shear mode piezoelectric elements 102A-102C and their corresponding masses 104A-104C are coupled in corresponding piezoelectric element and mass pairs. In this embodiment, the piezoelectric elements and masses are banded (e.g., using clamping device 110) to a center triangular-shaped binding post 202A of support block 202. It is to be understood that other piezoelectric element and mass structures can be used in order to satisfy sensitivity and/or ruggedness requirements of an application without departing from the scope of the present invention.

The above-described multi-layer enclosure is only one exemplary way to shield the sensing system from external stimuli. Accordingly, it is to be understood that a wide range of configurations, materials, and construction methods can be employed for shielding/desensitizing purposes without affecting the fundamental technology disclosed herein, as the shielding/insulating housing can be configured and constructed to accommodate the end use. For example, the present invention can be designed for incorporation within a satellite where size and weight is critical. The above-described multi-layer enclosure can be completely omitted to reduce weight within an environment that has little external stimuli, steady state temperatures, and consistent vibrational influences. Additionally, a unit's electronics could be condensed into a MEMS circuit with an integrated microprocessor to reduce a unit's overall size. Still further, enhanced layered RF shielding along with gradient RF shielding may be incorporated in other embodiments of the present invention when operation will occur near power equipment that produces extreme RF noise. Other applications that may experience dramatic thermal changes, such as a seismology monitor located in a desert region, can be outfitted with thicker thermal insulation, vacuum jacketing, and a thermal sink plate. In still other embodiments, the sensing system of the present invention can be included within an arctic seismology monitoring system such that the unit is coupled with an actively-powered thermal device to maintain a stable operating temperature. Other embodiments could use the multi-layer enclosure in a stationary research laboratory setting designed with a buffer area around the system to keep individuals from getting close to the sensing system and interfering with the accuracy of the measurements. In yet another embodiment of the present invention, the sensing system can be incorporated into a security system to detect the removal of a protected object's mass, wherein all the vibrational damping devices are removed to help detect intrusion within a restricted area.

The present invention can also be used to quantify other physical conditions such as vacuum levels and liquid detection by physically coupling the sensing system to a structure under test. For example, the sensing system could be used to detect the loss of a vacuum within a vacuum jacketed pipe without tapping into the piping by interchanging the sensing system's enclosure with a bondable base. The bondable base could be fastened to any location on the outside of a jacketed pipe and the sensing system would then be capable of quantifying a change to the internal vacuum levels. The different vacuum levels will dampen how the bonded sensing system will vibrate during the stimulus/response cycle thereby revealing the vacuum levels similar to the way gravity dampens the sensing system's reverberations. In the same way, the present invention could be used to detect the presence of liquid or the lack of liquid within a pipeline. For example, the presence of liquid nitrogen within a gaseous nitrogen supply line could be detected by simply bonding the sensing system and its enclosure to the outside of the pipe without exposing the sensor elements or electronics to the internal cryogenic conditions. The same would be true for detecting the formation of gas within a liquid nitrogen pipe as it can become hot enough to allow some of the liquid to change states into gaseous nitrogen. Both of these examples provide instances where monitoring is very important, and the current state of other sensory technologies makes this kind of detection difficult. Additional embodiments of the present invention can encompass different element configurations, vector analysis algorithms, and data reduction algorithms for enabling the measurement of other types of physical phenomena.

The advantages of the present invention are numerous. The sensing system can be configured to monitor/measure multiple types of static quantities such as gravity, static electricity, electrically charged fields, temperature, and magnetic fields. The support for the sensing system can be designed to desensitize the sensing system to a variety of unwanted external stimuli thereby limiting sensitivity of the sensing system to one or more stimuli of interest.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The disclosed embodiments were chosen and described in order to best explain the principles of the invention and the practical application, and to enable others of ordinary skill in the art to understand the disclosure for various embodiments with various modifications as are suited to the particular use contemplated.

I claim:

1. A piezoelectric field disturbance sensing system to sense external stimuli, said system comprising:

a piezoelectric element for generating mechanical energy when electrically excited and for generating electrical energy when mechanically deformed; a hard, rigid mass coupled to said piezoelectric element; a signal generator coupled to said piezoelectric element for applying electrical energy with said piezoelectric element for a fixed period of time, wherein said piezoelectric element undergoes mechanical deformation and wherein said mass reverberates in response to said mechanical deformation; and a charge monitor coupled to said piezoelectric element for monitoring—an—electrical energy of reverberation generated by said piezoelectric element during a second time period subsequent to said fixed period of time wherein said electrical energy of reverberation is directly indicative of a measurement of said external stimuli on said piezoelectric element.

2. A piezoelectric field disturbance sensing system as in claim 1, wherein said piezoelectric element comprises a compressive-type piezoelectric element.

3. A piezoelectric field disturbance sensing system as in claim 1, wherein said piezoelectric element comprises a shear-type piezoelectric element.

4. A piezoelectric field disturbance sensing system as in claim 1, further comprising at least one shield for encasing and desensitizing said piezoelectric element to mechanical deformation stimuli caused by at least one of vibrations, a local gravitational field, a local magnetic field, a local electrical field, a local electromotive field, a local electromagnetic field, a local electro-static field, a local radio frequency field, and a local thermal field.

5. A piezoelectric field disturbance sensing system as in claim 1, wherein said mass is adhesively bonded to said piezoelectric element.

6. A piezoelectric field disturbance sensing system as in claim 1, further comprising a clamping device for coupling said mass to said piezoelectric element.

7. A piezoelectric field disturbance sensing system as in claim 1, further comprising a support system for positioning said mass such that gravity is free to act thereon.

8. A piezoelectric field disturbance sensing system as in claim 7, wherein said support system desensitizes said piezoelectric element to mechanical deformation stimuli caused by vibrations, a local magnetic field, a local electrical field, a local electromotive field, a local electromagnetic field, a local electro-static field, a local radio frequency field, and a local thermal field.

9. A piezoelectric field disturbance sensing system to sense external stimuli, said system, comprising: a piezoelectric element for generating mechanical energy in a single dimension when electrically excited and for generating electrical energy when mechanically deformed in said single dimension; a hard, rigid mass coupled to said piezoelectric element; a signal generator coupled to said piezoelectric element for applying an electrical pulse to said piezoelectric element, wherein said piezoelectric element deforms mechanically in said single dimension and wherein said mass reverberates in response thereto; and a charge monitor coupled to said piezoelectric element for monitoring an electrical energy of reverberation generated by said piezoelectric element after said electrical pulse terminates, wherein said electrical energy of reverberation is directly indicative of a measurement of said external stimuli on said piezoelectric element.

10. A piezoelectric field disturbance sensing system as in claim 9, wherein said piezoelectric element comprises a compressive-type piezoelectric element.

11. A piezoelectric field disturbance sensing system as in claim 9, wherein said piezoelectric element comprises a shear-type piezoelectric element.

12. A piezoelectric field disturbance sensing system as in claim 9, further comprising at least one shield for encasing and desensitizing said piezoelectric element to mechanical deformation stimuli caused by at least one of vibrations, a local gravitational field, a local magnetic field, a local electrical field, a local electromotive field, a local electromagnetic field, a local electro-static field, a local radio frequency field, and a local thermal field.

13. A piezoelectric field disturbance sensing system as in claim 9, wherein said mass is adhesively bonded to said piezoelectric element.

14. A piezoelectric field disturbance sensing system as in claim 9, further comprising a clamping device for coupling said mass to said piezoelectric element.

15. A piezoelectric field disturbance sensing system as in claim 9, further comprising a support system for positioning said mass such that gravity is free to act thereon.

16. A piezoelectric field disturbance sensing system as in claim 15, wherein said support system desensitizes said piezoelectric element to mechanical deformation stimuli caused by vibrations, a local magnetic field, a local electrical field, a local electromotive field, a local electromagnetic field, a local electro-static field, a local radio frequency field, and a local thermal field.

17. A method of sensing field disturbances to sense external stimuli on an object, said method comprising the steps of:
providing a piezoelectric element for generating mechanical energy when electrically excited and for generating electrical energy when mechanically deformed; coupling a hard, rigid mass to said piezoelectric element;
applying electrical energy to said piezoelectric element for a fixed period of time such that said piezoelectric element undergoes mechanical deformation and wherein said mass to reverberates in response to said mechanical deformation thereby generating an electrical energy of reverberation; and monitoring said electrical energy of reverberation generated by said piezoelectric element during a second time after said fixed period of time wherein said electrical energy of reverberation is directly indicative of a measurement of said external stimuli on said piezoelectric element.

18. A method according to claim 17, wherein said piezoelectric element comprises a compressive-type piezoelectric element.

19. A method according to claim 17, wherein said piezoelectric element comprises a shear-type piezoelectric element.

20. A method according to claim 17, further comprising the step of encasing and desensitizing said piezoelectric element to mechanical deformation stimuli caused by at least one of vibrations, a local gravitational field, a local magnetic field, a local electrical field, a local electromotive field, a local electromagnetic field, a local electro-static field, a local radio frequency field, and a local thermal field.

21. A method according to claim 17, wherein said mass is adhesively bonded to said piezoelectric element.

22. A method according to claim 17, wherein said mass is mechanically held against said piezoelectric element.

* * * * *